US012635151B2

(12) United States Patent
Jin et al.

(10) Patent No.: US 12,635,151 B2
(45) Date of Patent: May 19, 2026

(54) DIGITAL ISOLATOR STRUCTURE AND METHOD FOR FORMING THE SAME

(71) Applicant: HUA HONG SEMICONDUCTOR (WUXI) LIMITED, Wuxi (CN)

(72) Inventors: Hongfeng Jin, Wuxi (CN); Hongxu Yang, Wuxi (CN); Hualun Chen, Wuxi (CN)

(73) Assignee: Hua Hong Semiconductor (WUXI) Limited, Wuxi (CN)

( * ) Notice: Subject to any disclaimer, the term of this patent is extended or adjusted under 35 U.S.C. 154(b) by 529 days.

(21) Appl. No.: 18/130,573

(22) Filed: Apr. 4, 2023

(65) Prior Publication Data

US 2023/0420496 A1 Dec. 28, 2023

(30) Foreign Application Priority Data

Jun. 23, 2022 (CN) .......................... 202210719277.4

(51) Int. Cl.
*H01L 21/02* (2006.01)
*H10D 1/00* (2025.01)
*H10D 1/68* (2025.01)
(52) U.S. Cl.
CPC ............. *H10D 1/042* (2025.01); *H10D 1/716* (2025.01)
(58) Field of Classification Search
CPC ... H01L 23/48; H01L 23/481; H01L 23/5226; H01L 21/76802; H01L 21/76831; H01L 21/76805; H01L 21/76832; H01L 21/76834; H01L 21/76843; H01L 21/7685; H01L 21/76877
See application file for complete search history.

(56) References Cited

U.S. PATENT DOCUMENTS

2004/0211953 A1* 10/2004 Khouri ................. H10N 70/011
438/257

FOREIGN PATENT DOCUMENTS

| CN | 112420661 | 2/2021 |
| CN | 114242766 | 3/2022 |
| CN | 114334916 | 4/2022 |
| TW | I632677 | 8/2018 |

OTHER PUBLICATIONS

First Office Opinion Notice from Chinese Patent Office in Chinese Patent Application CN115241373, dated Mar. 25, 2025.

* cited by examiner

*Primary Examiner* — John A Bodnar
(74) *Attorney, Agent, or Firm* — Boyle Fredrickson, S.C.

(57) ABSTRACT

The present disclosure provides a digital isolator structure and a method for forming the same. The method includes: providing a substrate; forming a first electrode plate on a surface of the substrate and forming a dielectric layer on the first electrode plate; etching the dielectric layer until the first electrode plate is exposed to form a deep trench in the dielectric layer; forming a connect layer on a bottom and a side surface of the deep trench and forming an insulating layer on at least a part of a surface of the connect layer; forming a lead-out electrode layer and a second electrode plate on a surface of the dielectric layer. The lead-out electrode layer is also disposed on a top surface of the connect layer. The method can reduce process steps and save cost of conductive materials.

15 Claims, 6 Drawing Sheets

DIGITAL ISOLATOR STRUCTURE AND METHOD FOR FORMING THE SAME

CROSS-REFERENCE TO RELATED APPLICATIONS

This application claims the benefit of priority to Chinese patent application No. 202210719277.4, filed on Jun. 23, 2022, the entire disclosures of which are incorporated herein by reference.

TECHNICAL FIELD

The present disclosure relates to the technical field of semiconductors, and more particularly to a digital isolator structure and a method for forming the digital isolator structure.

BACKGROUND OF THE INVENTION

Digital isolator is a device that realizes isolation between signals and between signals and users during signal transmission in a circuit system so as to protect a signal safety and user safety of a low-voltage module. The digital isolator includes two wafers, i.e., a transmitter and a receiver. The two wafers are connected by an isolation structure. The digital signal is input from one pin, modulated by a radio frequency carrier of a radio frequency oscillator and modulator, and sent to the receiver through the isolation structure. After receiving an attenuated radio frequency signal, the receiver demodulates and restores it to an output signal through a demodulator, and then outputs it from another pin.

A capacitive coupling isolation structure in the digital isolator is manufactured by semiconductor technology. Usually, a lower metal in a chip is used as a lower electrode plate of a capacitor, and a top metal in the chip is used as an upper electrode plate of the capacitor. A silicon dioxide dielectric layer having a thickness ranging from 5 μm to 20 μm is disposed between the top metal and the lower metal in the chip to provide sufficient pressure resistance. This thickness will bring great stress accumulation and lead to unacceptable wafer warpage, and thick dielectric layer will increase the difficulty of picking up the lower electrode plate.

Therefore, the process for forming the capacitive coupling isolation structure of the digital isolator needs to be further improved.

SUMMARY OF THE INVENTION

The present disclosure provides a digital isolator structure and a method for forming the digital isolator structure, which can reduce process steps and save cost of conductive materials.

According to an embodiment of the present disclosure, a digital isolator structure includes: a substrate; a first electrode plate disposed on a surface of the substrate and a dielectric layer disposed on the first electrode plate; a deep trench disposed in the dielectric layer, wherein the deep trench exposes the first electrode plate; a connect layer disposed on a bottom and a side surface of the deep trench and an insulating layer disposed on at least a part of a surface of the connect layer, wherein the insulating layer closes a top opening of the deep trench; and a lead-out electrode layer and a second electrode plate disposed on a surface of the dielectric layer, wherein the lead-out electrode layer is also disposed on a top surface of the connect layer.

According to some embodiments, the dielectric layer includes a plurality of stacked dielectric material layers, and directions of stresses in adjacent dielectric material layers are opposite.

According to some embodiments, a compressive stress or a tensile stress parallel to the surface of the substrate is generated in each dielectric material layer.

According to some embodiments, the substrate is disposed on a first side of a wafer, and the wafer also has a second side opposite to the first side, wherein a first stress is generated in the dielectric layer, and a second stress along a same direction as the first stress is generated in an auxiliary dielectric layer disposed on the second side of the wafer.

According to some embodiments, the first stress includes a compressive stress or a tensile stress parallel to the surface of the substrate, and the second stress includes a compressive stress or a tensile stress parallel to the surface of the substrate.

According to some embodiments, a thickness of the dielectric layer ranges from 5 μm to 20 μm, and an aspect ratio of the deep trench ranges from 2:1 to 10:1.

According to some embodiments, a thickness of the connect layer ranges from 200 nm to 700 nm.

According to some embodiments, a projection of the second electrode plate on a surface of the first electrode plate falls within a range of the first electrode plate.

According to another embodiment of the present disclosure, a method for forming a digital isolator structure includes: providing a substrate; forming a first electrode plate on a surface of the substrate and forming a dielectric layer on the first electrode plate; etching the dielectric layer until the first electrode plate is exposed to form a deep trench in the dielectric layer; forming a connect layer on a bottom and a side surface of the deep trench and forming an insulating layer on at least a part of a surface of the connect layer, wherein the insulating layer closes a top opening of the deep trench; and forming a lead-out electrode layer and a second electrode plate on a surface of the dielectric layer, wherein the lead-out electrode layer is also disposed on a top surface of the connect layer.

According to some embodiments, forming the connect layer includes: forming a connect material layer in the deep trench and on the surface of the dielectric layer; and planarizing the connect material layer until the surface of the dielectric layer is exposed to form the connect layer.

According to some embodiments, forming the connect material layer includes a chemical vapor deposition process.

According to some embodiments, forming the insulating layer includes: forming an insulating material layer in the deep trench and on the surface of the dielectric layer after forming the connect material layer, wherein the insulating material layer closes the top opening of the deep trench; and planarizing the insulating material layer until the surface of the dielectric layer is exposed.

According to some embodiments, forming the insulating material layer includes a sub-atmospheric pressure chemical vapor deposition process, a high-density plasma chemical vapor deposition process or a high aspect ratio deposition process.

According to some embodiments, the dielectric layer includes a plurality of stacked dielectric material layers, and directions of stresses in adjacent dielectric material layers are opposite.

According to some embodiments, a compressive stress or a tensile stress parallel to the surface of the substrate is generated in each dielectric material layer.

According to some embodiments, the substrate is disposed on a first side of a wafer, and the wafer also has a second side opposite to the first side, and a first stress is generated in the dielectric layer, wherein the method further includes: forming an auxiliary dielectric layer on the second side of the wafer after forming the dielectric layer and before forming the deep trench, and a second stress along a same direction as the first stress is generated in the auxiliary dielectric layer.

According to some embodiments, the first stress includes a compressive stress or a tensile stress parallel to the surface of the substrate, and the second stress includes a compressive stress or a tensile stress parallel to the surface of the substrate.

According to some embodiments, a barrier layer is disposed between the connect layer and a side wall of the deep trench.

According to some embodiments, a thickness of the dielectric layer ranges from 5 μm to 20 μm, and an aspect ratio of the deep trench ranges from 2:1 to 10:1.

According to some embodiments, a thickness of the connect layer ranges from 200 nm to 700 nm.

According to some embodiments, forming the deep trench includes a dry etching process.

According to some embodiments, the connect layer is formed by a material including tungsten.

According to some embodiments, a projection of the second electrode plate on a surface of the first electrode plate falls within a range of the first electrode plate.

The embodiments of the present disclosure have following beneficial effects:

In the method for forming the digital isolator structure, the dielectric layer is etched until the first electrode plate is exposed, the deep trench is formed in the dielectric layer, the connect layer is formed on the bottom and the side surface of the deep trench, and the insulating layer is formed on at least a part of the surface of the connect layer, and the insulating layer closes the top opening of the deep trench, thus the deep trench is formed by only one photolithography process, and the connect layer is formed in the deep groove to lead out a circuit of the first electrode plate, which can reduce process steps and save production costs. Further, the connect layer does not need to fill the deep trench, which can further save the cost of conductive materials.

Further, the dielectric layer includes a plurality of stacked dielectric material layers, and the directions of the stresses in the adjacent dielectric material layers are opposite, so that the stresses in two adjacent dielectric material layers can be offset or partially offset, which can reduce the stress in the dielectric layer, thereby reducing wafer warpage and an adverse effect of large wafer warpage on the process.

Further, the substrate is disposed on a first side of a wafer, and the wafer also has a second side opposite to the first side, and a first stress is generated in the dielectric layer, wherein the method further includes: forming an auxiliary dielectric layer on the second side of the wafer after forming the dielectric layer and before forming the deep trench, and a second stress along a same direction as the first stress is generated in the auxiliary dielectric layer. By forming the auxiliary dielectric layer on the second side of the wafer, the wafer warpage caused by the stress in the dielectric layer can be reduced. Further, as the dielectric layer and the auxiliary dielectric layer are disposed on two opposite sides of the wafer, the dielectric layer and the auxiliary dielectric layer can be formed by the same process, that is, a film preparation equipment only needs to manufacture a dielectric film with one stress type (i.e. a tensile stress or a compressive stress), which is conducive to reducing the complexity of the process.

DETAILED DESCRIPTION OF THE EMBODIMENTS

It should be noted that "surface" and "upper" in this specification are used to describe a relative position relationship of space and are not limited to direct contact.

Figure 1:
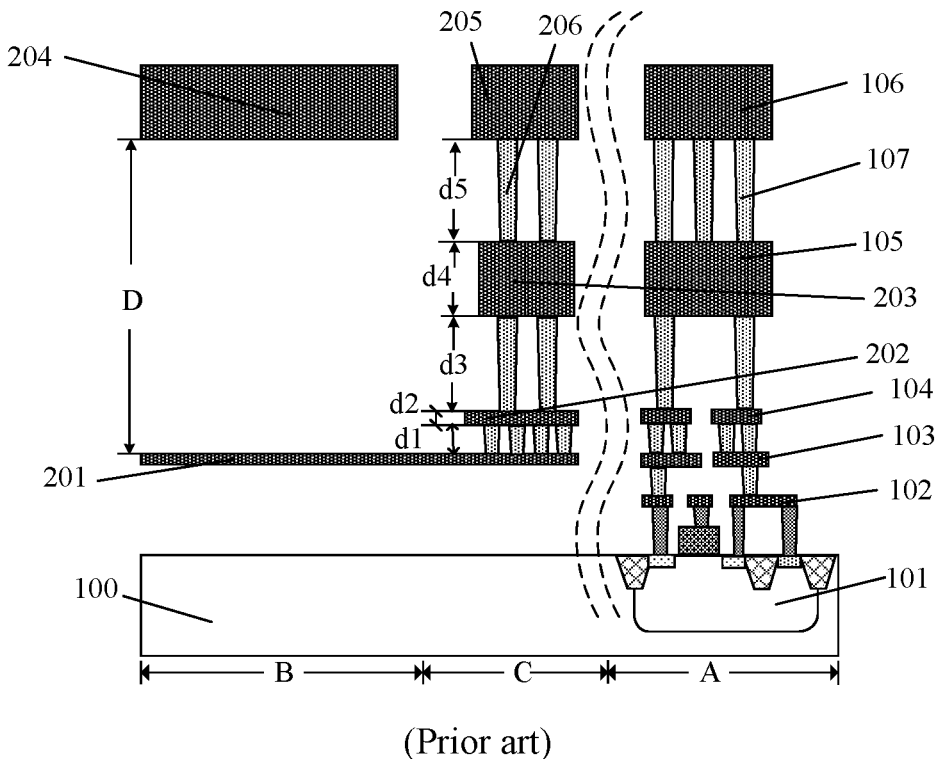
FIG. 1 is a sectional schematic view illustrating a formation process of a digital isolator structure.

FIG. 1 is a sectional schematic view illustrating a formation process of a digital isolator structure.

Referring to FIG. 1, a substrate 100 is provided. The substrate 100 includes a logic circuit area A and an isolation structure area. The isolation structure area includes a capacitance area B and a circuit lead-out area C. The logic circuit area A has a device structure 101. A first interconnection layer 102 electrically interconnected with the device structure 101 is formed on the logic circuit area A. After the first interconnection layer 102 is formed, a first metal layer is formed on the substrate 100. The first metal layer includes a second interconnection layer 103 disposed on the logic circuit area A and a first electrode plate 201 disposed on the isolation structure area, and the second interconnection layer 103 is electrically coupled with the first interconnection layer 102. After the second interconnection layer 103 is formed, a second metal layer is formed on the substrate 100. The second metal layer includes a third interconnection layer 104 disposed on the logic circuit area A and a first lead layer 202 disposed on the circuit lead-out area C. The first lead layer 202 is electrically interconnected with the first electrode plate 201. After the second metal layer is formed, a third metal layer is formed on the substrate 100. The third metal layer includes a fourth interconnection layer 105 disposed on the logic circuit area A and a second lead layer 203 disposed on the circuit outlet area C. The second lead layer 203 is electrically interconnected with the second lead layer 202. After the third metal layer is formed, a fourth metal layer is formed on the substrate. The fourth metal layer includes a top interconnection layer 106 disposed on the logic circuit area A, a second electrode plate 204 disposed on the capacitance area B, and a third lead layer 205 disposed on the circuit lead-out area C. The third lead layer 205 is electrically interconnected with the second lead layer 203.

In above method, the process of forming the metal interconnection layer in the logic circuit area A is used to form the capacitance of the digital isolator. The first metal layer, the second metal layer and the third metal layer are all formed in a silicon dioxide dielectric layer, and the first electrode plate 201 and the second electrode plate 204 form a capacitance. Several lead layers, including the first lead layer 202, the second lead layer 203 and the third lead layer 205, are used to lead out a lower electrode plate circuit, and the adjacent lead layers are interconnected through the first connect layer 206. Several interconnection layers, including the second interconnection layer 103, the third interconnection layer 104, the fourth interconnection layer 105 and the top interconnection layer 106, are interconnected by the second connect layer 107.

In order to achieve an ultra-high voltage isolation, a dielectric layer having a thickness ranging from 5 μm to 20 μm needs to be disposed between two electrode plates of the capacitor. In some embodiments, in order to avoid great stress caused by too large thickness of the dielectric layer, five dielectric layers are disposed between the first electrode plate 201 and the second electrode plate 204. Specifically, a distance D between the first electrode plate 201 and the second electrode plate 204 is about 10 μm, and the thickness of each dielectric layer is as follows: d1 is about 0.8 μm, d2 is about 0.5 μm, d3 is about 3 μm, d4 is about 2.4 μm, and d5 is about 3 μm. The lower electrode plate circuit is led out by the stacking of the metal lead layer and the connect layer, thus the stress between the lead layer and the dielectric layer can be offset, which can make a warpage of the wafer in a controllable range. However, the lead layer requires a large amount of metal materials, which increases the production cost. In addition, in order to cooperate with the capacitance forming the digital isolator structure, compared with the ordinary logic circuit process, more than six lithography layers are required, which greatly increases the production cost.

Figure 2:
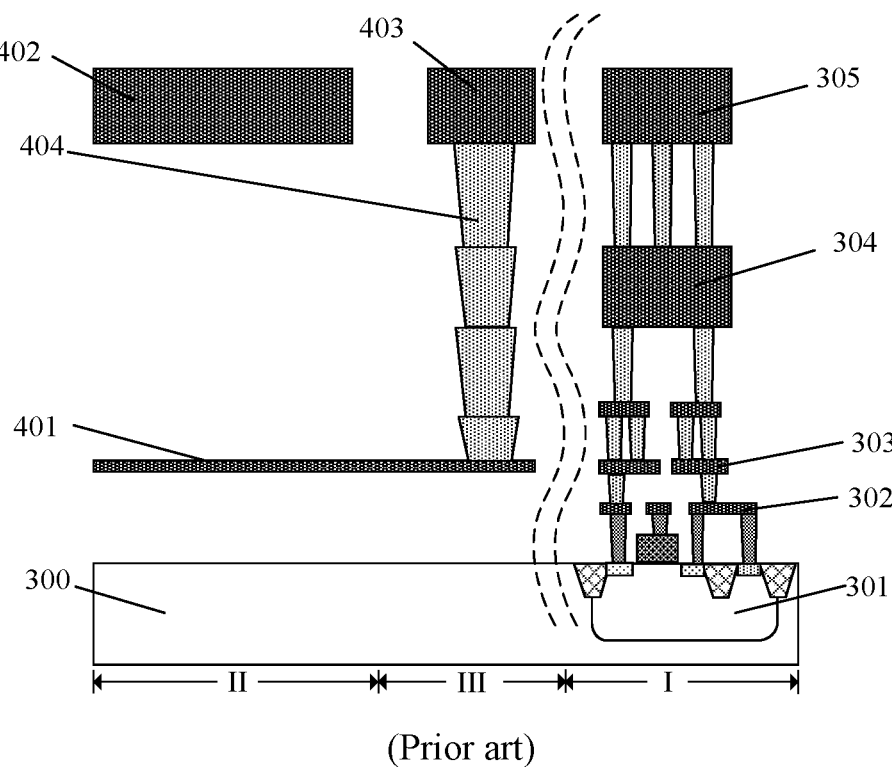
FIG. 2 is a sectional schematic view illustrating a formation process of another digital isolator structure.

In order to solve above problems, in some embodiments, the lead-out of the lower electrode plate circuit is realized by the stacking of the connect layers, as shown in FIG. 2.

FIG. 2 is a sectional schematic view illustrating a formation process of another digital isolator structure.

Referring to FIG. 2, a substrate 200 is provided. The substrate 200 includes a logic circuit area I and an isolation structure area. The isolation structure area includes a capacitance area II and a circuit lead-out area III, and the logic circuit area I has a device structure 301. A first interconnection layer 302 electrically interconnected with the device structure 301 is formed on the logic circuit area A. After the first interconnection layer 302 is formed, a first metal layer is formed. The first metal layer includes a second interconnection layer 303 disposed on the logic circuit area A and a first electrode plate 401 disposed on the isolation structure area. The second interconnection layer 303 and the first interconnection layer 302 are electrically connected with each other. After the first metal layer is formed, a plurality of second metal layers are formed, and each second metal layer includes a second interconnection layer 304 disposed on the logic circuit area I. After the plurality of second metal layers are formed, a top metal layer is formed. The top metal layer includes a top interconnection layer 305 disposed on the logic circuit area I, a second electrode plate 402 disposed on the capacitance area II and a lead layer 403 disposed on the circuit lead-out area III. The lead layer 403 and the first electrode plate 401 are electrically interconnected with each other.

In this embodiment, the lead layer 403 and the first electrode plate 401 are electrically interconnected with each other through a plurality of connect layers 404. The difference from above embodiment is that in this embodiment, the lead-out of the lower electrode plate circuit is realized by the stacking of the connect layers, which can save metal materials required to form the lead layers and a photolithography process required for etching the lead layers. However, the stacking of the connect layers still requires more lithographic layers, and the production cost is still high.

In order to solve above problems, the present disclosure provides a digital isolator structure and a method for forming the digital isolator structure. A dielectric layer is etched until a first electrode plate is exposed to form a deep trench in the dielectric layer, a connect layer is formed on a bottom and a side surface of the deep trench, an insulating layer is formed on at least a part of a surface of the connect layer, and an insulating layer closes a top opening of the deep trench, thus only one photolithography process is required to form the deep trench, and the connect layer is formed in the deep trench to lead out a circuit of the first electrode plate, which can reduce process steps and save production costs. Further, the connect layer does not need to fill the deep trench, which can further save the cost of conductive materials.

In order to make above purposes, features and beneficial effects of the present disclosure more obvious and understandable, specific embodiments of the present disclosure will be described in detail with the attached drawings.

FIGS. 3 to 10 are schematic views illustrating steps of a method for forming a digital isolator structure according to an embodiment of the present disclosure.

Figures 3, 4, 5:
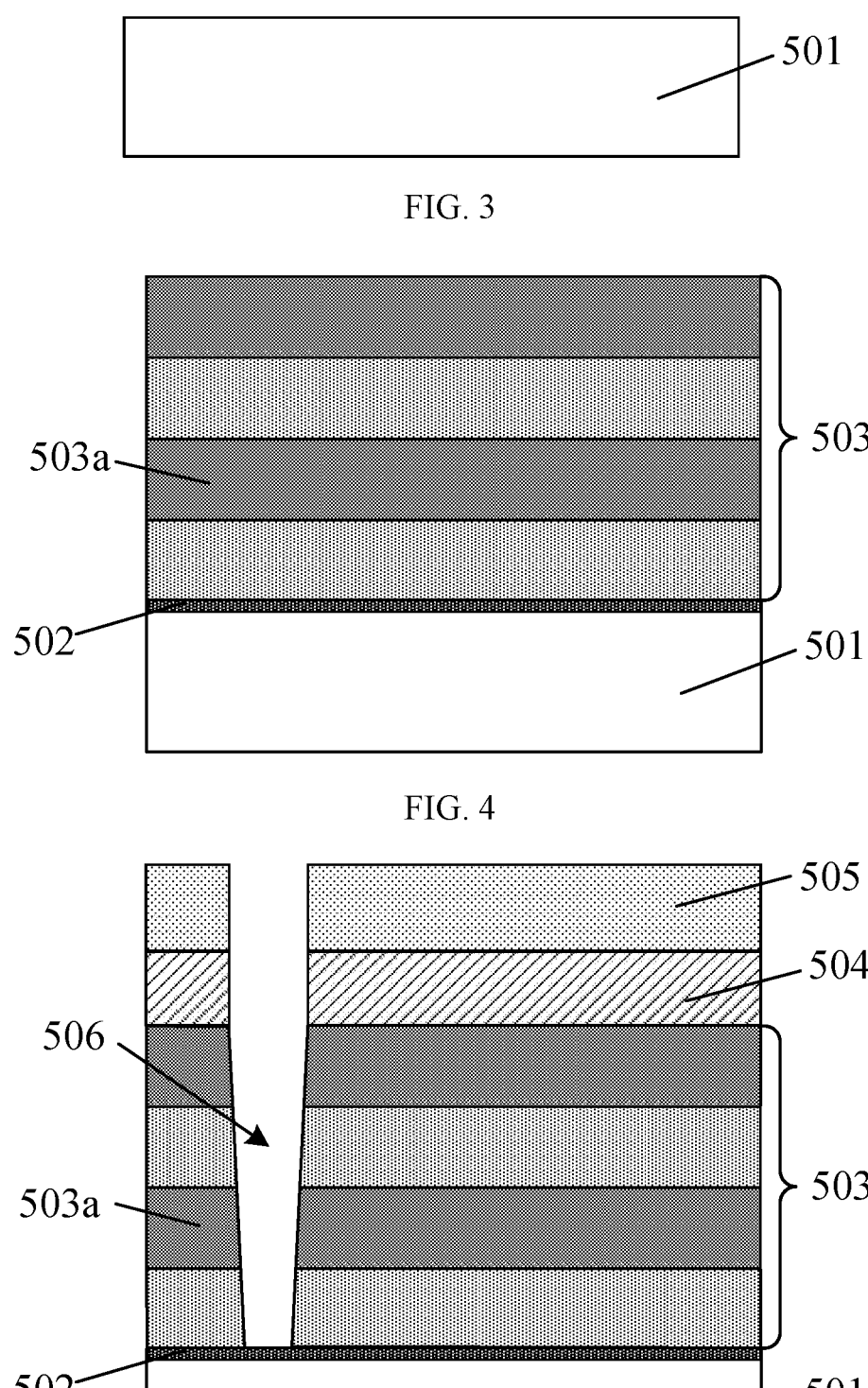
FIGS. 3 to 10 are schematic views illustrating steps of a method for forming a digital isolator structure according to an embodiment of the present disclosure.

Referring to FIG. 3, a substrate 501 is provided.

In some embodiments, the substrate 501 includes a base, a device layer (not shown in the figure) disposed on the base, and a metal interconnection layer (not shown in the figure) disposed on the device layer and electrically interconnected with the device layer.

Referring to FIG. 4, a first electrode plate 502 is formed on a surface of substrate 501, and a dielectric layer 503 is formed on the first electrode plate 502.

A thickness of the dielectric layer 503 ranges from 5 μm to 20 μm. With this thickness, a thicker dielectric layer can achieve an ultra-high pressure isolation.

In some embodiments, the dielectric layer 503 includes a plurality of stacked dielectric material layers 503a, and stress directions in adjacent dielectric material layers 503a are opposite. The stresses in two adjacent dielectric material layers 503a can be offset or partially offset, which can reduce the stress in the dielectric layer 503, thereby reducing the wafer warpage and the adverse effect of large wafer warpage on the process.

Specifically, each dielectric material layer 503a has a compressive stress or a tensile stress parallel to a surface of the substrate 501.

Referring to FIG. 5, the dielectric layer 503 is etched until the first electrode plate 502 is exposed to form a deep trench 506 in the dielectric layer 503.

An aspect ratio of the deep trench 506 ranges from 2:1 to 10:1.

The formation process of the deep trench 506 includes a dry etching process.

In some embodiments, the method for forming the deep trench 506 includes: forming a first patterned layer on a surface of the dielectric layer 503, wherein the first patterned layer includes a hard mask layer 504 and a photoresist layer 505 disposed on the hard mask layer 504; and etching the dielectric layer 503 using the first patterned layer as a mask.

The material of the hard mask layer 504 includes a dielectric material, and the dielectric material includes one or more of silicon oxide, silicon nitride, silicon oxynitride, silicon oxycarbide, silicon carbonitride and silicon oxycarbonitride. In some embodiments, the material of the first mask layer 105 is silicon oxide.

The method for forming the hard mask layer 504 includes: forming a mask material layer (not shown in the figure) on the surface of the dielectric layer 503; forming the photoresist layer 505 on a surface of the mask material layer, wherein the photoresist layer 505 exposes part of the mask material layer; and etching the mask material layer using the photoresist layer 505 as a mask.

In some embodiments, the first patterned layer is also removed after the deep trench 506 is formed.

Subsequently, a connect layer is formed on a bottom and a side surface of the deep trench 506, and an insulating layer is formed on at least a part of a surface of the connect layer. The insulating layer closes a top opening of the deep trench 506.

Figure 6:
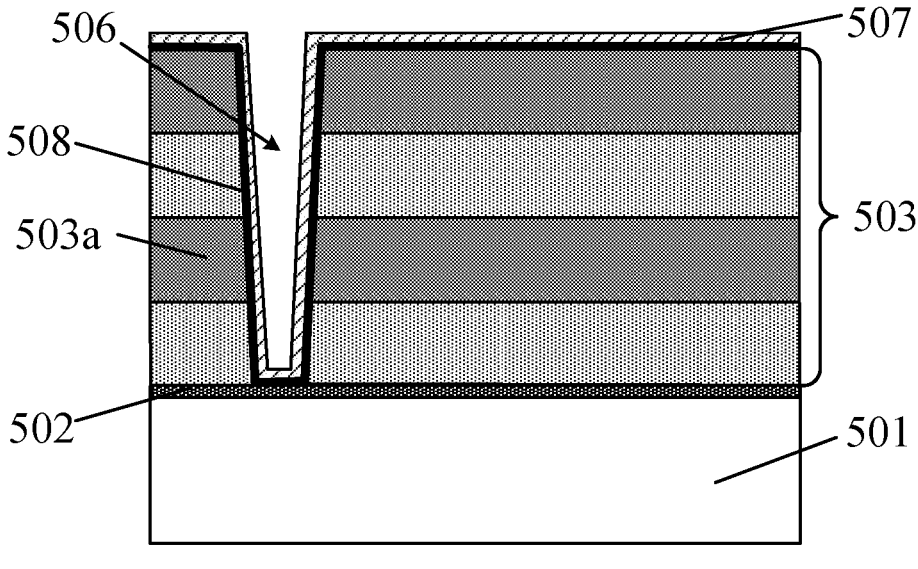
Figure 7:
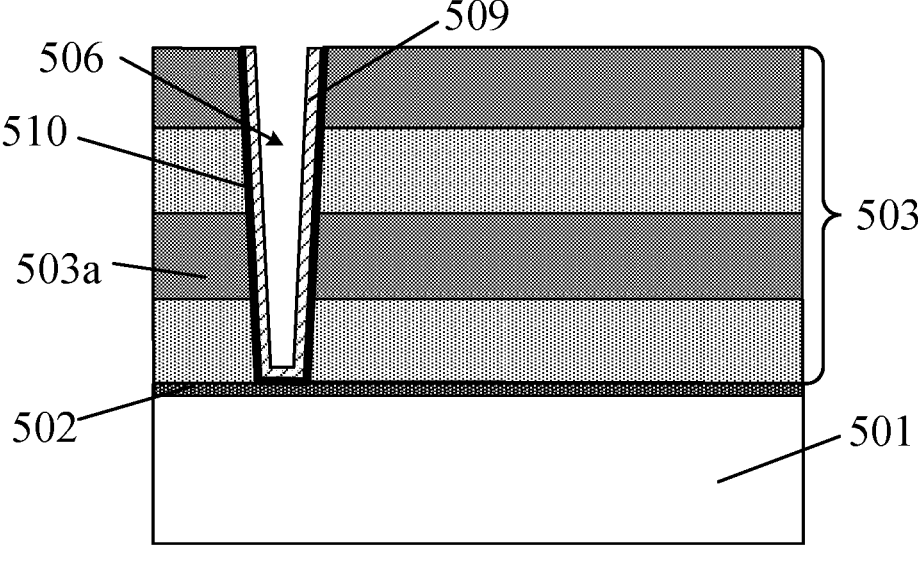

FIGS. 6 to 7 illustrate the method for forming the connect layer.

Referring to FIG. 6, a connect material layer 507 is formed on surfaces of the deep trench 506 and the dielectric layer 503.

In some embodiments, a barrier material layer 508 is also formed on the side surface and the bottom of the deep trench 506 before the connect material layer 507 is formed. Specifically, the barrier material layer 508 is also disposed on the surface of the dielectric layer 503.

The material of the connect material layer 507 includes tungsten. The connect material layer 507 is used to form the connect layer. In some embodiments, the reason for selecting tungsten material is that the chemical vapor deposition process is conducive to forming a more uniform connect material layer 507, and is conducive to obtaining a lower contact resistance. In other embodiments, the material of the connect material layer 507 is not limited to this, and can also be other metal materials.

A thickness of the connect material layer 507 ranges from 200 nm to 700 nm.

In some embodiments, the method for forming the connect material layer 507 includes a chemical vapor deposition process. The tungsten material formed by the chemical vapor deposition process has good step coverage and good filling effect during the filling process, which is conducive to improving the uniformity of the formed connect layer and improving the stability of device performance.

In some embodiments, the material of the barrier material layer 508 includes an adhesive material layer and an auxiliary material layer disposed on the adhesive material layer.

The material of the adhesive material layer includes titanium, and the material of the auxiliary material layer includes titanium nitride.

The auxiliary material layer is used to reduce the diffusion of metal ions in the connect layer to the dielectric layer 503. The adhesive material layer is used to increase an adhesion between the connect layer and the dielectric layer 503, and reduce the possibility of falling off of the connect layer.

Referring to FIG. 7, the connect material layer 507 is planarized until the surface of the dielectric layer 503 is exposed to form a connect layer 509.

The connect layer 509 does not need to fill the deep trench 506, which can further save the cost of conductive materials.

A thickness of the connect layer 509 ranges from 200 nm to 700 nm.

The material of the connect layer 509 includes tungsten.

In some embodiments, the barrier material layer 508 is also planarized to form a barrier layer 510. That is, the barrier layer 510 is disposed between the connect layer 509 and a side wall of the deep trench 506.

Figure 8:
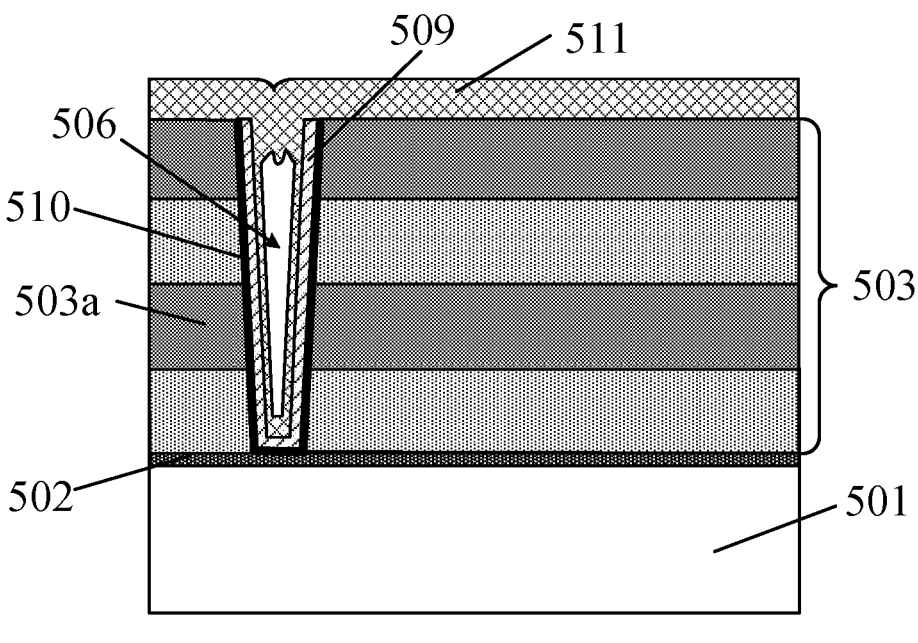
Figure 9:
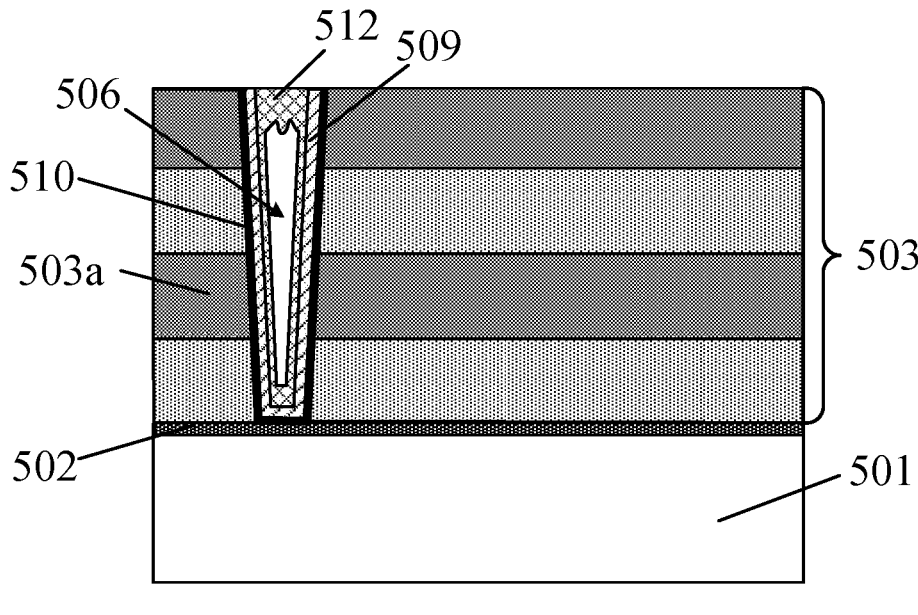

FIGS. 8 to 9 illustrate the method for forming the insulating layer.

Referring to FIG. 8, after the connect material layer 507 is formed, an insulating material layer 511 is formed in the deep trench 506 and on the surface of the dielectric layer

503, and the insulating material layer 511 closes the top opening of the deep trench 506.

The method for forming the insulating material layer 511 includes a sub-atmospheric pressure chemical vapor deposition process, a high-density plasma chemical vapor deposition process or a high aspect ratio deposition process. In some embodiments, the method for forming the insulating material layer 511 includes a high aspect ratio deposition process. The high aspect ratio deposition process is conducive to filling the insulating material in the deep trench 506, which can reduce the situation that the top opening of the deep trench 506 cannot be closed in the subsequent process of planarizing the insulating material layer 511 due to too thin insulating material layer 511 at the top opening of the deep trench 506. Thus, the possibility of the material of subsequent formed lead-out electrode plate entering the deep trench 506 is reduced.

In some embodiments, specifically, after the connect layer 509 is formed, the insulating material layer 511 is formed in the deep trench 506 and on the surface of the dielectric layer 503, and the insulating material layer 511 closes the top opening of the deep trench 506. In other embodiments, the insulating material layer can also be formed after the connect material layer is formed and before the connect layer is formed.

Referring to FIG. 9, the insulating material layer 511 is planarized until the surface of the dielectric layer 503 is exposed to form an insulating layer 512.

The deep trench 506 is formed in the dielectric layer 503, the connect layer 509 is formed on the bottom and the side surface of the deep trench 506, and the insulating layer 512 is formed on at least a part of the surface of the connect layer 509, and the insulating layer 512 closes the top opening of the deep trench 506, thus the deep trench 506 is formed by only one photolithography process, and the connect layer 509 is formed in the deep trench 506 to lead out a circuit of the first electrode plate 502, which can reduce process steps and save production costs. Further, the connect layer 509 does not need to fill the deep trench 506, which can further save the cost of conductive materials.

In some embodiments, the planarizing process is performed after the connect layer 509 is formed. In other embodiments, the insulating material layer is formed after the connect material layer is formed and before the connect layer is formed. Therefore, after the planarizing process, the connect material layer is also planarized to form the connect layer.

Figure 10:
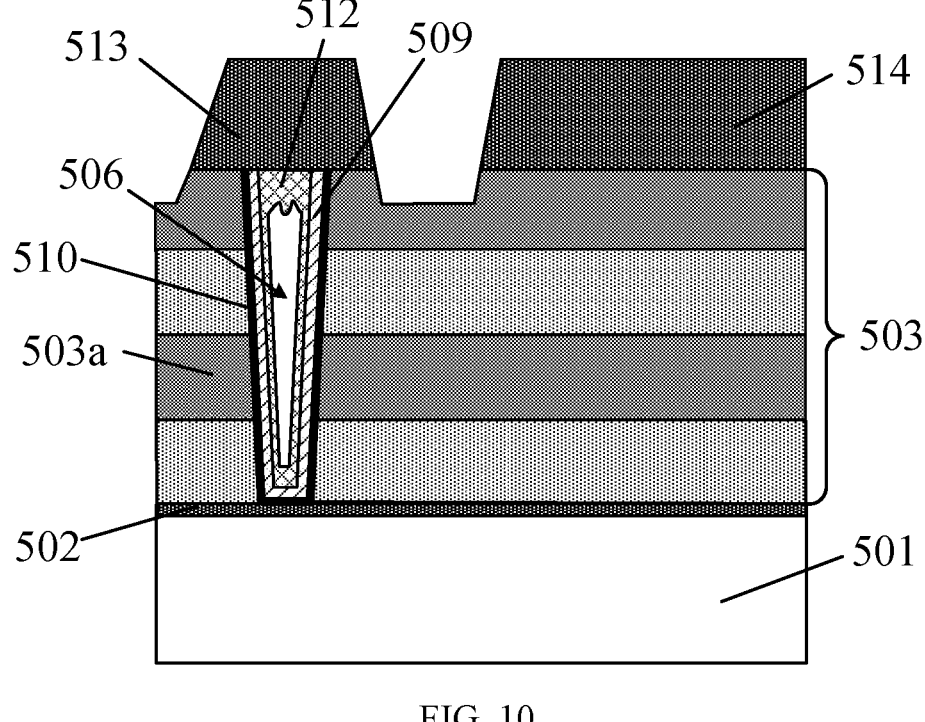

Referring to FIG. 10, a lead-out electrode layer 513 and a second electrode plate 514 are formed on the surface of the dielectric layer 503, and the lead-out electrode layer 513 is also disposed on a top surface of the connect layer 509.

Specifically, the lead-out electrode layer 513 is also disposed on a surface of the insulating layer 512. The insulating layer 512 can protect the connect layer 509 and prevent the lead-out electrode plate 513 from extending into the deep trench 506.

In some embodiments, a projection of the second electrode plate 514 on a surface of the first electrode plate 502 falls within a range of the first electrode plate 502. The second electrode plate 514, the first electrode plate 502 and the dielectric layer 503 form a capacitor.

In some embodiments, the method for forming the lead-out electrode layer 513 and the second electrode plate 514 includes: forming a metal material layer (not shown in the figure) on the surface of the dielectric layer 503, the connect layer 509 and the top surface of the insulating layer 512; forming a second patterned layer (not shown in the figure)

on a surface of the metal material layer; and etching the metal material layer using the second patterned layer as a mask until the surface of the dielectric layer 503 is exposed.

In some embodiments, the material of the second patterned layer includes photoresist material.

Accordingly, an embodiment of the present disclosure also provides a digital isolator structure formed by the above method. Still referring to FIG. 10, the digital isolator structure includes: a substrate 501; a first electrode plate 502 on a surface of the substrate 501 and a dielectric layer 503 on the first electrode plate 502; a deep trench 506 disposed in the dielectric layer 503, wherein the deep trench 506 exposes the first electrode plate 502; a connect layer 509 disposed on a bottom and a side surface of the deep trench 506 and an insulation layer 512 disposed on at least a part of a surface of the connect layer 509, wherein the insulation layer 512 closes a top opening of the deep trench 506; a lead-out electrode layer 513 and a second electrode plate 514 disposed on a surface of the dielectric layer 503, wherein the lead-out electrode layer 513 is also disposed on a top surface of the connect layer 509.

In some embodiments, the dielectric layer 503 includes a plurality of stacked dielectric material layers 503a, and the stress directions in adjacent dielectric material layers 503a are opposite.

In some embodiments, a compressive stress or as tensile stress parallel to the surface of the substrate 501 is generated in each dielectric material layer 503.

In some embodiments, a thickness of the dielectric layer 503 ranges from 5 μm to 20 μm, and an aspect ratio of the deep trench ranges from 2:1 to 10:1.

In some embodiments, a thickness of the connect layer 509 ranges from 200 nm to 700 nm.

In some embodiments, a projection of the second electrode plate 514 on a surface of the first electrode plate 502 falls within a range of the first electrode plate 502. The second electrode plate 514, the first electrode plate 502 and the dielectric layer 503 form a capacitor.

Figure 11:
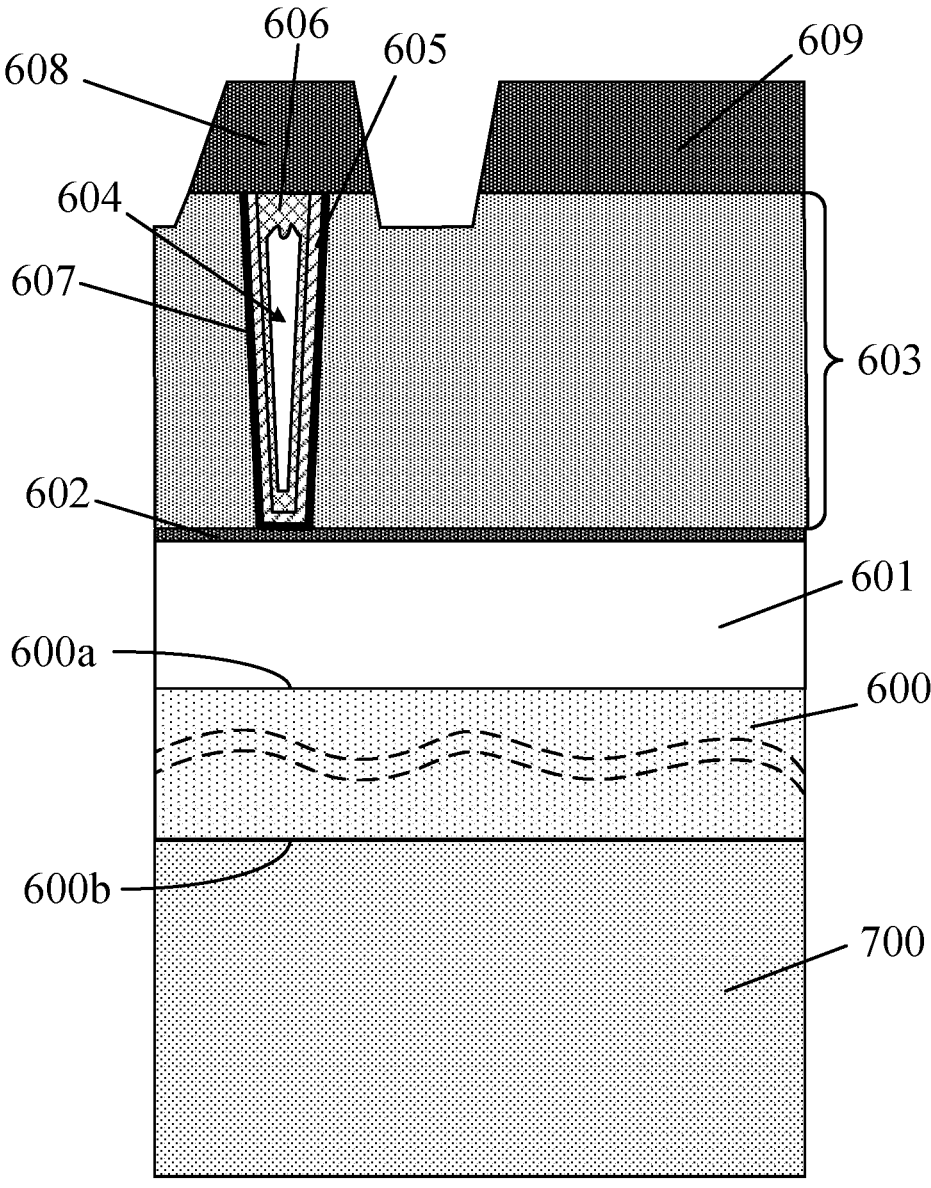
FIG. 11 is a schematic view illustrating steps of a method for forming a digital isolator structure according to another embodiment of the present disclosure.

FIG. 11 is a schematic view illustrating steps of a method for forming a digital isolator structure according to another embodiment of the present disclosure The main difference between this embodiment and above embodiment is that the method for forming the dielectric layer is different.

Referring to FIG. 11, a substrate 601 is provided. A first electrode plate 602 is formed on a surface of the substrate 601, and a dielectric layer 603 is formed on the first electrode plate 602. The dielectric layer 603 is etched until the first electrode plate 602 is exposed to form a deep trench 604 in the dielectric layer 603. A connect layer 605 is formed on a bottom and a side surface of the deep trench 604 and an insulating layer 606 is formed on at least a part of a surface of the connect layer 605, and the insulating layer 606 closes a top opening of the deep trench 604. A lead-out electrode layer 608 and a second electrode plate 609 are formed on a surface of the dielectric layer 603, and the lead-out electrode layer 608 is also disposed on a top surface of the connect layer 605.

In some embodiments, a barrier layer 607 is disposed between the connect layer 605 and a side wall of the deep trench 604.

In some embodiments, except for the dielectric layer, the method for forming the digital isolator structure is described in the previous embodiment, which is not repeated herein.

In some embodiments, the substrate 601 is disposed on a first side 600a of a wafer 600, and the wafer 600 also has a second side 600b opposite to the first side 600a. A first stress is generated in the dielectric layer 603.

In some embodiments, after the dielectric layer 603 is formed and before the deep trench 604 is formed, an auxiliary dielectric layer 700 is formed on the second side 600b, and a second stress is generated in the auxiliary dielectric layer 700. The first stress and the second stress are along the same direction.

The first stress includes a compressive stress or a tensile stress parallel to the surface of the substrate, and the second stress includes a compressive stress or a tensile stress parallel to the direction of the surface of the substrate. In some embodiments, the first stress and the second stress are both compressive stress.

In some embodiments, the auxiliary dielectric layer 700 is formed on the second side 600b of the wafer 600, which can reduce wafer warpage caused by the stress in the dielectric layer 603. Further, as the dielectric layer 603 and the auxiliary dielectric layer 700 are disposed on two opposite sides of the wafer 600, the dielectric layer 603 and the auxiliary dielectric layer 700 can be formed by the same process, that is, a film preparation equipment only needs to modulate a dielectric film with one stress type (i.e. a tensile stress or a compressive stress), which can reduce the difficulty of the process.

Accordingly, another embodiment of the present disclosure also provides a digital isolator structure formed by the above method. Still referring to FIG. 11, the digital isolator structure includes: a substrate 601, a first electrode plate 602 disposed on a surface of the substrate 601 and a dielectric layer 603 disposed on the first electrode plate 602; a deep trench 604 disposed in the medium layer 603, wherein the deep trench 604 exposes the first electrode plate 602; a connect layer 605 disposed on a bottom and a side surface of the deep trench 604 and an insulation layer 606 disposed on at least a part of a surface of the connect layer 605, wherein the insulation layer 606 closes a top opening of the deep trench 604; a lead-out electrode layer 608 and a second electrode plate 609 disposed on a surface of the dielectric layer 603, wherein the lead-out electrode layer 608 is also disposed on a top surface of the connect layer 605.

In some embodiments, the substrate 601 is disposed on a first side 600a of a wafer 600, and the wafer 600 also has a second side 600b opposite to the first side 600a. A first stress is generated in the dielectric layer 603. An auxiliary dielectric layer 700 is disposed on the second side 600b, and a second stress is generated in the auxiliary dielectric layer 700. The first stress and the second stress are along the same direction.

In some embodiments, the first stress includes a compressive stress or a tensile stress parallel to the surface of the substrate 601, and the second stress includes a compressive stress or a tensile stress parallel to the surface of the substrate 601.

In some embodiments, a thickness of the dielectric layer 603 ranges from 5 μm to 20 μm, and an aspect ratio of the deep trench 604 ranges from 2:1 to 10:1.

In some embodiments, a thickness of the connect layer 605 ranges from 200 nm to 700 nm.

In some embodiments, a projection of the second electrode plate 609 on the surface of the first electrode plate 602 falls within the range of the first electrode plate 602. The second electrode plate 609, the first electrode plate 602 and the dielectric layer 603 form a capacitor.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. A method for forming a digital isolator structure, comprising:

providing a substrate;

forming a first electrode plate on a surface of the substrate and forming a dielectric layer on the first electrode plate;

etching the dielectric layer until the first electrode plate is exposed to form a deep trench in the dielectric layer;

forming a connect layer on a bottom and a side surface of the deep trench and forming an insulating layer on at least a part of a surface of the connect layer, wherein the insulating layer closes a top opening of the deep trench; and forming a lead-out electrode layer and a second electrode plate on a surface of the dielectric layer, wherein the lead-out electrode layer is also disposed on a top surface of the connect layer.

2. The method according to claim 1, wherein forming the connect layer comprises:

forming a connect material layer in the deep trench and on the surface of the dielectric layer; and planarizing the connect material layer until the surface of the dielectric layer is exposed to form the connect layer.

3. The method according to claim 2, wherein forming the connect material layer comprises a chemical vapor deposition process.

4. The method according to claim 2, wherein forming the insulating layer comprises:

forming an insulating material layer in the deep trench and on the surface of the dielectric layer after forming the connect material layer, wherein the insulating material layer closes the top opening of the deep trench; and planarizing the insulating material layer until the surface of the dielectric layer is exposed.

5. The method according to claim 4, wherein forming the insulating material layer comprises a sub-atmospheric pressure chemical vapor deposition process, a high-density plasma chemical vapor deposition process or a high aspect ratio deposition process.

6. The method according to claim 1, wherein the dielectric layer comprises a plurality of stacked dielectric material layers, and directions of stresses in adjacent dielectric material layers are opposite.

7. The method according to claim 6, wherein a compressive stress or a tensile stress parallel to the surface of the substrate is generated in each dielectric material layer.

8. The method according to claim 1, wherein the substrate is disposed on a first side of a wafer, and the wafer also has a second side opposite to the first side, and a first stress is generated in the dielectric layer, wherein the method further comprises: forming an auxiliary dielectric layer on the second side of the wafer after forming the dielectric layer and before forming the deep trench, and a second stress along a same direction as the first stress is generated in the auxiliary dielectric layer.

9. The method according to claim 8, wherein the first stress comprises a compressive stress or a tensile stress parallel to the surface of the substrate, and the second stress comprises a compressive stress or a tensile stress parallel to the surface of the substrate.

10. The method according to claim 1, wherein a barrier layer is disposed between the connect layer and a side wall of the deep trench.

11. The method according to claim 1, wherein a thickness of the dielectric layer ranges from 5 μm to 20 μm, and an aspect ratio of the deep trench ranges from 2:1 to 10:1.

12. The method according to claim 1, wherein a thickness of the connect layer ranges from 200 nm to 700 nm.

13. The method according to claim 1, wherein forming the deep trench comprises a dry etching process.

14. The method according to claim 1, wherein the connect layer is formed by a material including tungsten.

15. The method according to claim 1, wherein a projection of the second electrode plate on a surface of the first electrode plate falls within a range of the first electrode plate.

* * * * *